(12) United States Patent
Imai

(10) Patent No.: US 6,461,907 B2
(45) Date of Patent: Oct. 8, 2002

(54) SEMICONDUCTOR DEVICE AND FABRICATION METHOD

(75) Inventor: Kiyotaka Imai, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/782,056

(22) Filed: Feb. 14, 2001

(65) Prior Publication Data
US 2001/0005030 A1 Jun. 28, 2001

Related U.S. Application Data

(62) Division of application No. 09/288,314, filed on Apr. 8, 1999, now Pat. No. 6,222,234.

(30) Foreign Application Priority Data

Apr. 15, 1998 (JP) .............................................. 10-104563

(51) Int. Cl.[7] ...................... H01L 21/8238; H01L 21/00
(52) U.S. Cl. ...................... 438/217; 438/151; 438/153; 438/154
(58) Field of Search ................................. 438/149, 151, 438/153, 154, 165, 275, 164, 985, 157; 437/62, 69, 70, 244, 21, 24, 41

(56) References Cited

U.S. PATENT DOCUMENTS

| 5,081,058 A | * | 1/1992 | Sasaki ........................ 438/144 |
| 5,145,802 A | * | 9/1992 | Tyson et al. ................. 438/154 |
| 5,479,033 A | | 12/1995 | Baca et al. |
| 5,650,339 A | * | 7/1997 | Saito et al. .................. 438/164 |
| 5,728,609 A | * | 3/1998 | Kerber ........................ 438/149 |
| 5,827,755 A | | 10/1998 | Yonehara et al. |

* cited by examiner

Primary Examiner—Olik Chaudhuri
Assistant Examiner—David L. Hogans
(74) Attorney, Agent, or Firm—Sughrue Mion, PLLC

(57) ABSTRACT

A method for forming a semiconductor device that has a fully depleted MOSFET and a partially depleted MOSFET having excellent characteristics on the same substrate without effecting control by means of the impurity concentration of the channel region. A semiconductor device is provided with a fully-depleted SOI MOSFET and a partially-depleted SOI MOSFET on the same SOI substrate through isolation by an element isolation film. The SOI substrate includes a buried oxide film and a SOI layer provided in succession on a silicon substrate.

7 Claims, 5 Drawing Sheets

GATE BORON

SEMICONDUCTOR DEVICE AND FABRICATION METHOD

This is a divisional of application Ser. No. 09/288,314 (Confirmation Number not yet assigned) filed Apr. 8, 1999 now U.S. Pat. No. 6,224,234, the disclosure of which is incorporated herein by reference.

BACKGROUND OF THE INVENTION

1. Field of the Invention

The present invention relates to a semiconductor device in which a partially-depleted SOI MOSFET (Silicon On Insulator—Metal Oxide Semiconductor—Field-Effect Transistor) and fully-depleted SOI MOSFET are provided on the same substrate, and a method of fabricating such a semiconductor device. In greater detail, the invention relates to a semiconductor device, and to the fabrication method of the semiconductor device, in which the difference in threshold voltage between a fully-depleted SOI MOSFET and partially-depleted SOI MOSFET is small, and moreover, in which the impurity concentration of the channel region of the fully-depleted SOI MOSFET is higher than in the prior art.

2. Description of the Related Art

An SOI MOSFET formed on an SOI substrate having an SOI layer has the advantages of small junction capacitance of the source/drain regions and a small substrate bias effect compared with a MOSFET that is formed on a bulk substrate of the prior art. This type of SOI MOSFET is receiving attention as a device with excellent high-speed performance capabilities.

There are two types of SOI MOSFET: partially-depleted SOI MOSFET and fully-depleted SOI MOSFET. A fully-depleted SOI MOSFET is a MOSFET in which film thickness $T_{SOI}$ of the SOI layer is thinner than the maximum depletion layer width $W_{max}$; and a partially-depleted SOI MOSFET is a MOSFET in which the film thickness $T_{SOI}$ of the SOI layer is greater than the maximum depletion layer width $W_{max}$. The maximum depletion layer width $W_{max}$ is given by the following equation:

$$W_{max} = (2 \, \varepsilon_{si} \, \varepsilon_0 \, 2 \, \phi_F / qN_A)^{1/2} \quad (1)$$

$$\phi_F = (k \, T / q) \ln (N_A / n_i)$$

$$= 0.0259 \ln (N_A / 1.5 \times 10^{10}) \text{ (when } T = 300K)$$

where $\varepsilon_{si}$ is the relative dielectric constant, $\varepsilon_0$ is the dielectric constant of a vacuum, q is the elementary charge, $N_A$ is the concentration of impurities, k is Boltzmann's constant, and T is temperature.

Because its threshold voltage can be set to a high level, a partially-depleted SOI MOSFET can suppress the standby leakage current of a transistor to a low level. A fully-depleted SOI MOSFET, on the other hand, can reduce subthreshold swing (S) and therefore enable high-speed operation at low voltage.

LSI with excellent characteristics are capable of high-speed operation with a low standby leak current and electrical or electronic equipment can be realized by forming these two types of MOSFET on the same SOI substrate and combining them by circuitry.

Formation of a partially-depleted SOI MOSFET, however, requires a design in which film thickness $T_{SOI}$ of the SOI layer is increased, or the concentration of impurities $N_A$ is raised and $W_{max}$ decreased in accordance with equation (1).

Formation of a fully-depleted SOI MOSFET, on the other hand, requires a design in which film thickness $T_{SOI}$ of the SOI layer is decreased, or the concentration of impurities $N_A$ is reduced and $W_{max}$ increased in accordance with equation (1).

According to M. J. Sherony et al. in "Minimization of Threshold Voltage Variation in SOI MOSFETs" (Proceedings, 1994 IEEE International SOI Conference pp. 131–132, October 1994), a region in which threshold voltage is not dependent on the film thickness of the SOI layer and which maintains a fixed value is a partially-depleted MOSFET, and a region in which threshold voltage decreases together with a decrease in the film thickness of the SOI layer is a fully-depleted MOSFET.

In the above-cited reference, moreover, an SOI layer film thickness of 59 nm and a channel region impurity concentration $N_A$ of $5 \times 10^{17}$ cm$^{-3}$ results in a partially-depleted SOI MOSFET, while an SOI layer film thickness of 59 nm and a channel region impurity concentration $N_A$ of $2 \times 10^{17}$ cm$^{-3}$ results in a fully-depleted SOI MOSFET.

Referring to FIG. 1A–FIG. 1D, explanation is next presented regarding a prior-art fabrication method of a semiconductor device in which a fully-depleted MOSFET and a partially-depleted MOSFET are formed on the same substrate. In this method, an n-channel partially-depleted SOI MOSFET and an n-channel fully-depleted SOI MOSFET are formed on the same substrate by changing the impurity concentration in the channel region.

Element isolation oxide film 4 is first formed on a SOI substrate composed of silicon substrate 1, buried oxide film 2, and SOI layer 3 as shown in FIG. 1A, thereby forming fully-depleted SOI MOSFET formation region 12 and partially-depleted SOI MOSFET formation region 14. The film thickness of SOI layer 3 after the formation of element isolation oxide film 4 is set to, for example, 63 nm.

Next, boron is injected as an impurity for threshold control in a first gate boron injection process. The dosage in the first gate boron injection is set to, for example, $2 \times 10^{17}$ cm$^{-3}$, a concentration that enables formation of a fully-depleted SOI MOSFET.

Next, mask composed of resist is formed by photolithography in fully-depleted SOI MOSFET formation region 12, as shown in FIG. 1B. Boron is then selectively injected as an impurity for threshold control in only partially-depleted SOI MOSFET formation region 14 in a second gate boron injection process.

The dosage in the second boron injection process is set to, for example, $5 \times 10^{17}$ cm$^{-3}$, a concentration that, combined with the dosage of the previous first gate boron injection process, allows formation of a partially-depleted SOI MOSFET.

As shown in FIG. 1C, the mask is next removed and gate oxide film 5 is formed at a prescribed film thickness of, for example, 8 nm in all regions of the SOI substrate. The film thickness of SOI layer 3 is hereupon reduced by the film formation of gate oxide film 5 to approximately 59 nm.

Finally, as shown in FIG. 1D, gate electrode 6 is formed, following which impurity is injected for source/drain region formation, and source/drain region 7 is formed.

The above-described fabrication method results in film thickness $T_{SOI}^1$ of SOI layer 3 of $T_{SOI}^1 = 59$ nm and a channel region impurity concentration $N_A$ of $2 \times 10^{17}$ cm$^{-3}$ in fully-depleted SOI MOSFET formation region 12. In partially-depleted SOI MOSFET formation region 14, on the other hand, film thickness $T_{SOI}^2$ is 59 nm, and the channel region impurity concentration $N_A$ is $5 \times 10^{17}$ cm$^{-3}$.

However, the construction of partially-depleted SOI MOSFET formation region 14 and fully-depleted SOI MOS- FET formation region 12 in the above-described method are distinguished only by the impurity concentrations, and this results in a large difference in threshold voltage $V_t$ between partially-depleted SOI MOSFET 14 and fully-depleted SOI MOSFET 12. This difference is, for example, 0.5 V in the example of the previously cited reference, and performance is therefore degraded. In addition, the impurity concentration of fully-depleted SOI MOSFET 12 must be made much lower, rendering the construction susceptible to the short channel effect.

On the other hand, forming both of partially-depleted SOI MOSFET 14 and fully-depleted SOI MOSFET 12 in their respective ideal constructions requires optimization of the film thickness of the SOI layer and the impurity concentration of each of partially-depleted SOI MOSFET 14 and fully-depleted SOI MOSFET 12, thereby leading to more processes as well as higher fabrication costs.

SUMMARY OF THE INVENTION

It is an object of the present invention to provide a semiconductor device having a partially-depleted SOI MOSFET and fully-depleted SOI MOSFET having excellent characteristics on the same substrate without controlling the impurity concentrations in the channel region, and a fabrication method for producing such a semiconductor device.

In other words, the film thickness of a gate oxide film, the film thickness of the SOI layer, and the impurity concentration of the channel region for a fully-depleted SOI MOSFET are reduced from the film thickness of the gate oxide film, film thickness of the SOI layer, and impurity concentration of the channel region for a partially-depleted SOI MOSFET. By means of this construction, the present invention is directed to a semiconductor device having a fully depleted SOI MOSFET and a partially depleted SOI MOSFET having excellent characteristics and having little difference in threshold voltage that are formed on the same substrate without entailing more processes than the prior art and without controlling the impurity concentration of the channel region. In addition, the method of the invention is intended to realize an ideal method for fabricating the semiconductor device according to this invention.

To achieve the above-described objects, the semiconductor device according to the invention (hereinbelow referred to as "the first embodiment") is a semiconductor device provided with a partially-depleted SOI MOSFET and a fully-depleted SOI MOSFET on the same substrate; and includes: a silicon substrate; a buried oxide film; a gate oxide film having a film thickness that is thinner in the fully-depleted SOI MOSFET than in the partially-depleted SOI MOSFET; a SOI layer having a film thickness that is thinner in the fully-depleted SOI MOSFET than in the partially-depleted SOI MOSFET; a channel region impurity concentration that is lower in the fully-depleted SOI MOSFET than in the partially-depleted SOI MOSFET; a source/drain region; and a gate electrode.

Another semiconductor device according to the present invention (hereinbelow referred to as "the second embodiment") is a semiconductor device provided with a partially-depleted SOI MOSFET and a fully-depleted SOI MOSFET on the same substrate, including: a silicon substrate; a buried oxide film; a gate oxide film having a film thickness that is the same in the fully-depleted SOI MOSFET and the partially-depleted SOI MOSFET; an SOI layer having a film thickness that is thinner in the fully-depleted SOI MOSFET than in the partially-depleted SOI MOSFET; a channel region impurity concentration, which is an impurity concentration, that is lower in the fully-depleted SOI MOSFET than in the partially-depleted SOI MOSFET; a source/drain region; and a gate electrode.

In addition, the fabrication method of the present invention is a method for fabricating a semiconductor device provided with a partially-depleted SOI MOSFET and a fully-depleted SOI MOSFET on the same substrate, and includes: a step for forming a fully-depleted SOI MOSFET formation region and a partially-depleted SOI MOSFET formation region by isolating elements in the SOI layer of an SOI substrate that includes, in succession, a buried oxide film and an SOI layer on a silicon substrate; an injection step for injecting at the same dosage the same impurities for threshold control into the SOI layer of both the fully-depleted SOI MOSFET formation region and the partially-depleted SOI MOSFET formation region; a first gate oxide film formation step for forming a first gate oxide film on the SOI layer of both regions; a step for removing the first gate oxide film on the SOI layer in the fully-depleted SOI MOSFET formation region; and a step for forming, in the fully-depleted SOI MOSFET formation region, a gate oxide film that is thinner than the gate oxide film of the partially-depleted SOI MOSFET formation region.

Another fabrication method of the present invention is a method for fabricating a semiconductor device provided with a partially-depleted SOI MOSFET and fully-depleted SOI MOSFET on the same substrate, and includes: a step for forming a fully-depleted SOI MOSFET formation region and a partially-depleted SOI MOSFET formation region by isolating elements in the SOI layer of an SOI substrate that includes, in succession, a buried oxide film and an SOI layer on a silicon substrate; an injection step for injecting at the same dosage the same impurities for threshold control into the SOI layer of both the fully-depleted SOI MOSFET formation region and the partially-depleted SOI MOSFET formation region;

a first gate oxide film formation step for forming a first gate oxide film on the SOI layer of both regions; a step for removing the first gate oxide film on the SOI layer of the fully-depleted SOI MOSFET formation region; a step for forming, in the fully-depleted SOI MOSFET formation region, a gate oxide film that is thinner than the gate oxide film of the partially-depleted SOI MOSFET formation region; a step for removing the gate oxide film on the SOI layer of both the fully-depleted SOI MOSFET formation region and the partially-depleted SOI MOSFET formation region; and a step for forming a new gate oxide film on the SOI layer of both the fully-depleted SOI MOSFET formation region and the partially-depleted SOI MOSFET formation region.

The above and other objects, features, and advantages of the present invention will become apparent from the following description with reference to the accompanying drawings which illustrate examples of the present invention.

DETAILED DESCRIPTION OF THE PREFERRED EMBODIMENTS

Figure 1A:
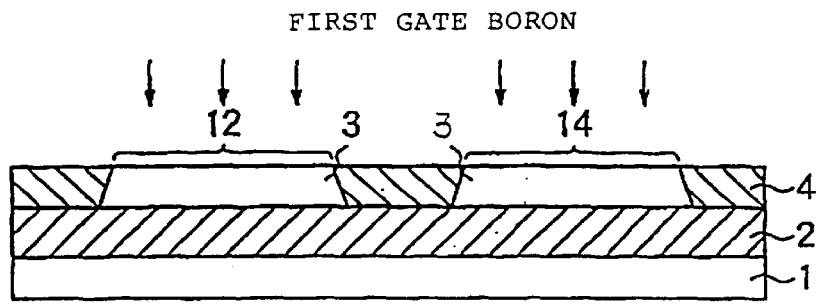
FIGS. 1A to 1D are sectional views showing the layer construction in each of the steps of fabricating a semiconductor device according to the prior art.
Figure 1B:
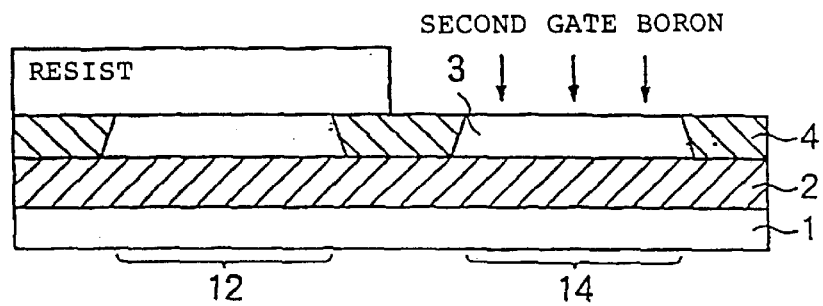
Figure 1C:
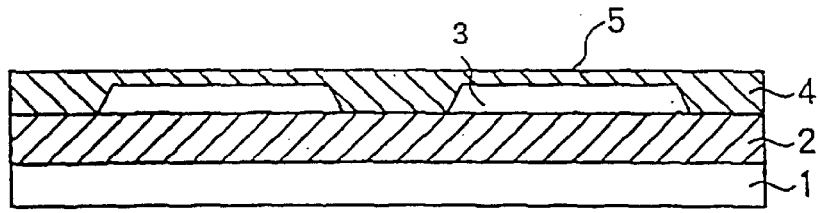
Figure 1D:
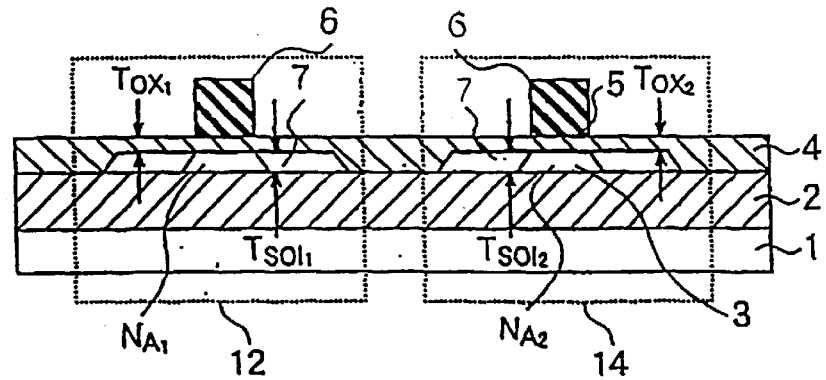

Explanation is first presented regarding the first embodiment of the invention. FIG. 2E, which shows this embodiment, is a sectional view showing the layer structure of semiconductor device 10. Of the parts shown in FIGS. 2A–2E and FIGS. 3A–3F, those parts having the same functions as the parts shown in FIGS. 1A–1D are identified by the same reference numerals.

As shown in FIG. 2E, semiconductor device 10 of this embodiment is provided with fully-depleted SOI MOSFET 12 and partially-depleted SOI MOSFET 14 on the same SOI substrate and isolated from each other by element isolation film 4. SOI substrate includes buried oxide film 2 and SOI layer 3 provided in succession on silicon substrate 1.

In fully-depleted SOI MOSFET 12 of semiconductor device 10, film thickness $T_{OX}^1$ of gate oxide film 5 is less than or equal to 8 nm, film thickness $T_{SOI}^1$ of SOI layer 3 is 56 nm, and the boron concentration $N_A^1$ of the channel region is $3 \times 10^{17}$ cm$^{-3}$. In partially-depleted SOI MOSFET 14, on the other hand, film thickness $T_{OX}^2$ of gate oxide film 5 is 12 nm, film thickness $T_{SOI}^2$ of SOI layer 3 is 59 nm, and the boron concentration $N_A^2$ of the channel region is $5 \times 10^{17}$ cm$^{-3}$.

Explanation is next presented with reference to FIGS. 2A–2E regarding the fabrication method of semiconductor device 10 of the first embodiment. FIGS. 2A–2E are sectional views showing the layer structure at each step of fabricating semiconductor device 10.

Figure 2A:
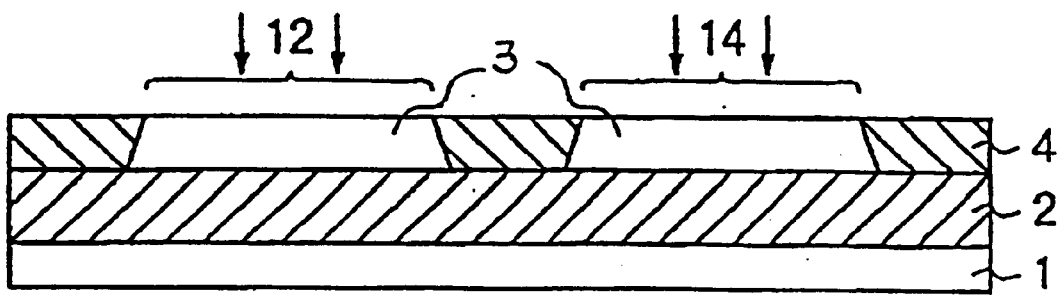
FIGS. 2A to 2E are sectional views showing the layer construction in each of the steps of fabricating a semiconductor device according to the first embodiment.

First, as shown in FIG. 2A, element isolation oxide film 4 is formed on an SOI substrate that includes buried oxide film 2 and silicon-on-insulator SOI layer 3 formed in succession on silicon substrate 1, thereby forming fully-depleted SOI MOSFET formation region 12 and partially-depleted SOI MOSFET formation 14. The film thickness of SOI layer 3 following formation of element isolation oxide film 4 is set to, for example, 65 nm. Gate boron for controlling the threshold value is then injected into SOI layer 3, the dosage of this gate boron injection being set to, for example, $5 \times 10^{17}$ cm$^{-3}$.

Figure 2B:
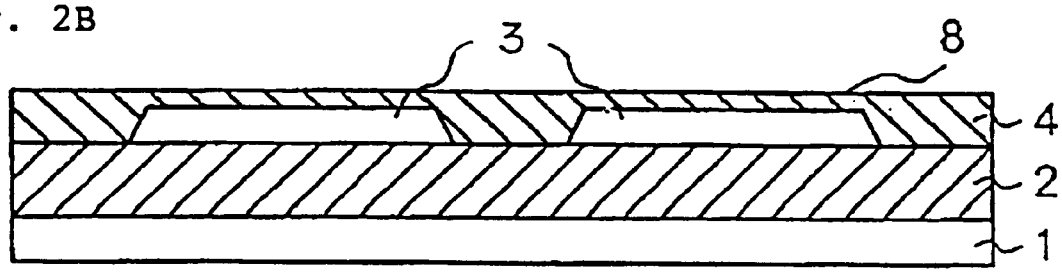

Next, as shown in FIG. 2B, first gate oxide film 8 having a film thickness of 10 nm is grown over the entire surface of the SOI substrate. In the process of growing first gate oxide film 8, the silicon of the surface layer of SOI layer 3 is consumed by the oxide film growth, and the film thickness of SOI layer 3 therefore decreases to about 60 nm. A thermal oxidation method may be used in growing this gate oxide film.

Figure 2C:
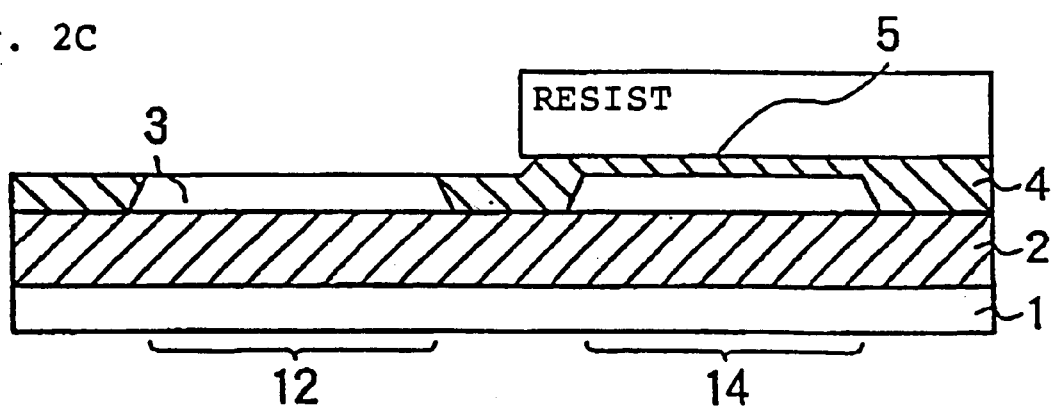

Next, as shown in FIG. 2C, a mask composed of resist is formed on partially-depleted SOI MOSFET formation region 14 by photolithography and etching, and first gate oxide film 8 is selectively removed from fully-depleted SOI MOSFET formation region 12. Part 5 in FIG. 2C represents the first gate oxide film remaining on partially-depleted SOI MOSFET formation region 14.

Figure 2D:
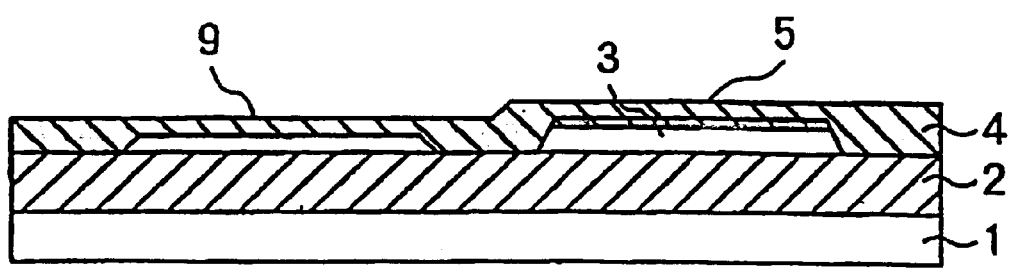
Figure 2E:
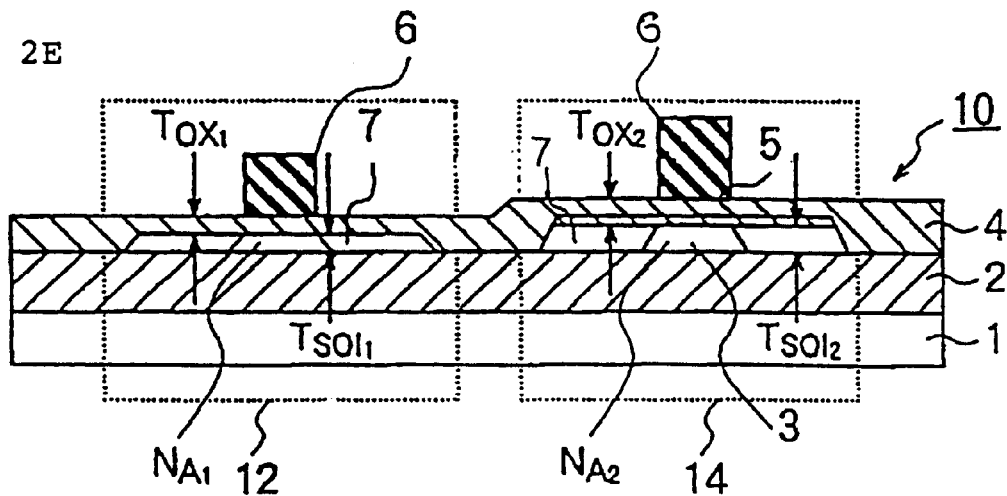

Next, as shown in FIG. 2D, the mask is removed, and second gate oxide film 9 is grown over all regions of the substrate. The film thickness of second gate oxide film 9 is 8 nm in fully-depleted SOI MOSFET formation region 12. SOI layer 3 that is to underlie second gate oxide film 9 is reduced to a film thickness of 56 nm for forming second gate oxide film 9. On the other hand, the film thickness of gate oxide film 5 on partially-depleted SOI MOSFET formation region 14 in which first gate oxide film remains increases to 12 nm due to additional oxidation, and the film thickness of SOI layer 3 becomes 59 nm.

In fully-depleted SOI MOSFET formation region 12, boron in the channel region is taken into first gate oxide film 8 at the time of forming the first gate oxide film and then lost during oxide film etching, and the boron concentration in the channel region therefore decreases from $5 \times 10^{17}$ cm$^{-3}$ to $3 \times 10^{17}$ cm$^{-3}$.

Next, as shown in FIG. 2E, gate electrodes 6 are formed in each of fully-depleted SOI MOSFET formation region 12 and partially-depleted SOI MOSFET formation region 14.

As a result of the above-described processes, film thickness $T_{OX}^1$ of gate oxide film 5 is 8 nm, film thickness $T_{SOI}^1$ of SOI layer 3 is 56 nm, and the channel region boron concentration $N_A^1$ is $3 \times 10^{17}$ cm$^{-3}$ in fully-depleted SOI MOSFET 12. On the other hand, film thickness $T_{OX}^2$ of gate oxide film 5 is 12 nm, film thickness $T_{SOI}^2$ of SOI layer 3 is 59 nm, and the channel region boron concentration $N_A^2$ is $5 \times 10^{17}$ cm$^{-3}$ in partially-depleted SOI MOSFET 14.

In this embodiment, both the boron concentration $N_A^1$ and the film thickness $T_{SOI}^1$ of the SOI layer of fully-depleted SOI MOSFET 12 can be made lower than that of partially-depleted SOI MOSFET 14 without adding to the number of processes of the prior-art fabrication method.

Moreover, in comparison to the example of the prior art in which only the impurity concentration of the channel region was regulated, the difference in threshold voltage $V_t$ between fully-depleted SOI MOSFET 12 and partially-depleted SOI MOSFET 14 is reduced to as little as 0.3 V.

In addition, the impurity concentration of fully-depleted SOI MOSFET 12 can be set to a higher level than in the example of the prior art, whereby a construction can be realized that is resistant to the short channel effect.

Explanation is next presented regarding the second embodiment. This embodiment is an example of an embodiment of a semiconductor device according to the second invention. FIG. 3F is a section view showing the layer construction of a semiconductor device of this embodiment.

Semiconductor device 20 of this embodiment is provided with fully-depleted SOI MOSFET 12 and partially-depleted SOI MOSFET 14 on the same SOI substrate separated by element isolation film 4 as shown in FIG. 3F. SOI substrate is provided with buried oxide film 2 and SOI layer 3 on silicon substrate 1.

In partially-depleted SOI MOSFET 14 of semiconductor device 20, film thickness $T_{SOI}^2$ of SOI layer 3 is 59 nm and channel region boron concentration $N_A^2$ is $5 \times 10^{17}$ cm$_{-3}$. In fully-depleted SOI MOSFET 12 on the other hand, film thickness $T_{SOI}^1$ of SOI layer 3 is 56 nm and channel region boron concentration $N_A^1$ is $3 \times 10^{17}$ cm$_{-3}$.

In contrast with semiconductor device 10 of the first embodiment, semiconductor device 20 of this embodiment has gate oxide film 5 of the same film thickness for partially-depleted-SOI MOSFET 14 and fully-depleted SOI MOSFET 12.

Explanation is next presented with reference to FIGS. 3A–3F regarding the fabrication method of semiconductor device 20 of the second embodiment. FIGS. 3A–3F are sectional views showing the layer construction at each step of fabricating semiconductor device 20.

Figure 3A:
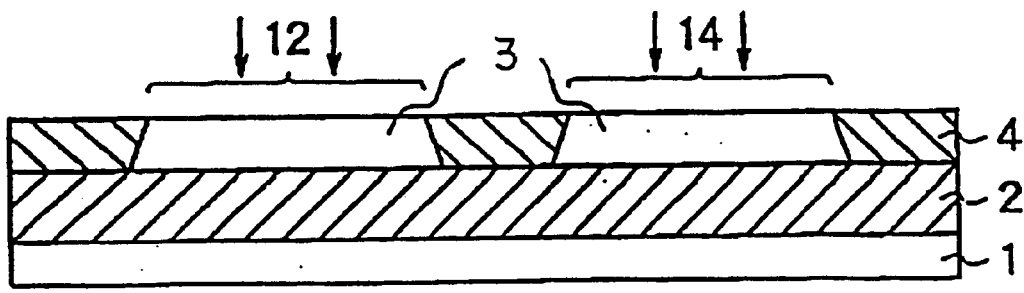
FIGS. 3A to 3F are sectional views showing the layer construction in each of the steps for fabricating a semiconductor device according to the second embodiment.

First, as shown in FIG. 3A, element isolation film 4 is formed on an SOI substrate that includes buried oxide film 2 and SOI layer 3 formed in succession on silicon substrate 1, thereby forming fully-depleted SOI MOSFET formation region 12 and partially-depleted SOI MOSFET formation region 14. The film thickness of SOI layer 3 following formation of element isolation film 4 is set to, for example, 65 nm.

Gate boron for threshold control is next injected into SOI layer 3. The dosage of this gate boron injection is set to, for example, $5 \times 10^{17}$ cm$^{-3}$.

Figure 3B:
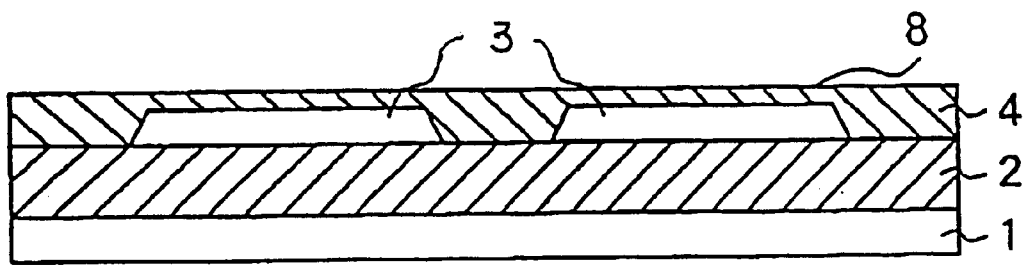

As shown in FIG. 3B, first gate oxide film 8 having a film thickness of 10 nm is next grown on the SOI substrate. At this time, the surface silicon of SOI layer 3 is consumed by the growth of first gate oxide film 8, reducing the film thickness of SOI layer 3 to about 60 nm. A thermal oxidation method may be used for forming this gate oxide film.

Figure 3C:
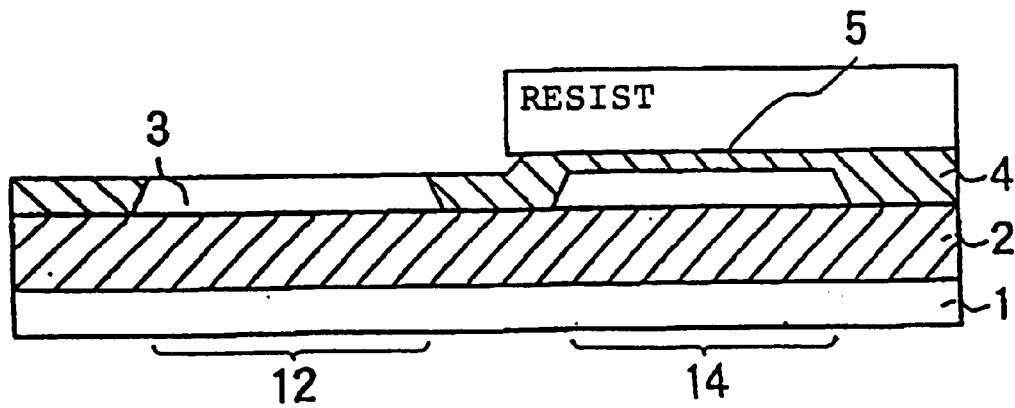

A mask composed of resist is next formed by means of photolithography and etching on partially-depleted SOI MOSFET formation region 14 as shown in FIG. 3C, and first gate oxide film 8 of fully-depleted SOI MOSFET formation region 12 is selectively removed. Portion 5 in FIG. 3C indicates the first gate oxide film that remains on the partially-depleted SOI MOSFET formation region 14.

Figure 3D:
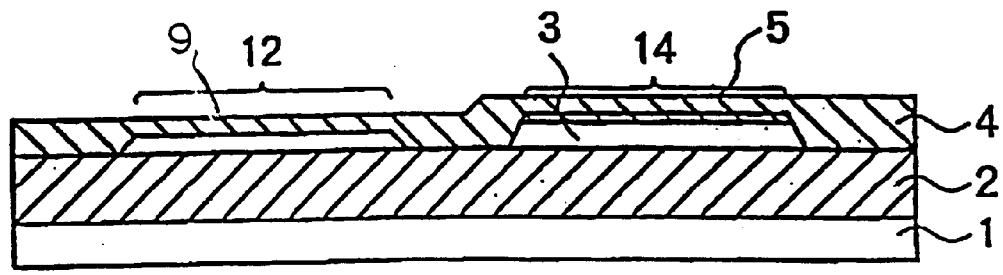

Next, the resist mask is removed and second gate oxide film 9 is then formed over all regions of the SOI substrate, as shown in FIG. 3D. The film thickness of gate oxide film 9 in fully-depleted SOI MOSFET formation region 12 in which first gate oxide film 8 has been removed becomes 8 nm, and the film thickness of SOI layer 3 becomes 56 nm. In fully-depleted SOI MOSFET formation region 12, the boron of the channel region is taken into first gate oxide film 8 during formation of the gate oxide and then lost during etching of the oxide film, whereby the boron concentration of the channel region decreases from $5 \times 10^{17}$ cm$^{-3}$ to $3 \times 10^{17}$ cm$^{-3}$.

On the other hand, the film thickness of the gate oxide film on partially-depleted SOI MOSFET formation region 14 in which first gate oxide film 5 remains becomes 12 nm due to additional oxidation, and the film thickness of SOI layer 3 becomes 59 nm.

Figure 3E:
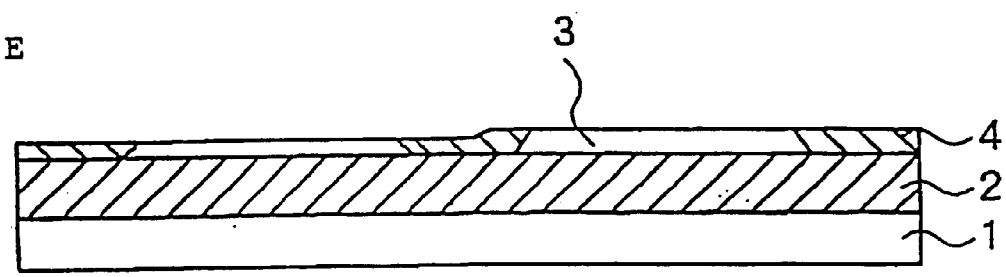
Figure 3F:
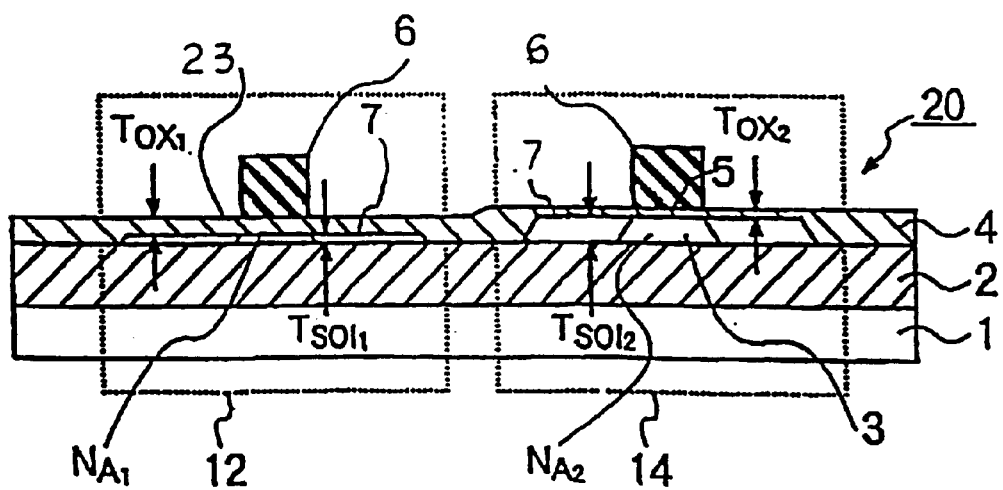

Second gate oxide film 9 is next completely removed from fully-depleted SOI MOSFET formation region 12 and partially-depleted SOI MOSFET formation region 14, as shown in FIG. 3E.

Next, as shown in FIG. 3F, third gate oxide film 23 having a film thickness of 8 nm is grown, following which gate electrode 6 is formed.

In the second embodiment, fully-depleted SOI MOSFET 12 and partially-depleted SOI MOSFET 14 have different SOI film thicknesses and impurity concentrations, as in the first embodiment, but this embodiment also includes gate oxide film 23 having the same film thickness as the gate oxide film.

While preferred embodiments of the present invention have been described using specific terms, such description is for illustrative purposes only, and it is to be understood that changes and variations may be made without departing from the spirit or scope of the following claims.

What is claimed is:

1. A method for fabricating a semiconductor device provided with a partially-depleted SOI MOSFET and a fully-depleted SOI MOSFET on the same substrate, comprising the steps of:

forming a fully-depleted SOI MOSFET formation region and a partially-depleted SOI MOSFET formation region by isolating elements in an SOI layer of an SOI substrate that includes, in succession, a buried oxide film and an SOI layer on a silicon substrate;

injecting, at a same dosage, same impurities for threshold control into the SOI layer of both said fully-depleted SOI MOSFET formation region and said partially-depleted SOI MOSFET formation region;

forming a first gate oxide film on the SOI layer of both said fully-depleted SOI MOSFET formation region and said partially-depleted SOI MOSFET formation region;

removing said first gate oxide film on the SOI layer in said fully-depleted SOI MOSFET formation region; and forming, in said fully-depleted SOI MOSFET formation region, a gate oxide film that is thinner than the gate oxide film of said partially-depleted SOI MOSFET formation region.

2. A method for fabricating a semiconductor device provided with a partially-depleted SOI MOSFET and a fully-depleted SOI MOSFET on the same substrate, comprising the steps of:

forming a fully-depleted SOI MOSFET formation region and a partially-depleted SOI MOSFET formation region by isolating elements in an SOI layer of an SOI substrate that includes, in succession, a buried oxide film and an SOI layer on a silicon substrate;

injecting, at a same dosage, same impurities for threshold control into the SOI layer of both said fully-depleted SOI MOSFET formation region and said partially-depleted SOI MOSFET formation region;

forming a first gate oxide film on the SOI layer of both said fully-depleted SOI MOSFET formation region and said partially-depleted SOI MOSFET formation region;

removing said first gate oxide film on the SOI layer of the fully-depleted SOI MOSFET formation region;

forming, in said fully-depleted SOI MOSFET formation region, a gate oxide film that is thinner than the gate oxide film of said partially-depleted SOI MOSFET formation region;

removing the gate oxide film on the SOI layer of both said fully-depleted SOI MOSFET formation region and said partially-depleted SOI MOSFET formation region; and forming a new gate oxide film on the SOI layer of both said fully-depleted SOI MOSFET formation region and said partially-depleted SOI MOSFET formation region.

3. A method of fabricating a semiconductor device according to claim 2 wherein, in said step for forming a new gate oxide film on the SOI layer both said fully-depleted SOI MOSFET formation region and said partially-depleted SOI MOSFET formation region, a gate oxide film of the same film thickness is formed on the SOI layer of both said fully-depleted SOI MOSFET formation region and said partially-depleted SOI MOSFET formation region.

4. A method of fabricating a semiconductor device according to claim 1 wherein:

said partially-depleted SOI MOSFET and said fully-depleted SOI MOSFET are n-channel MOSFETs; and boron is injected in said injection step.

5. A method of fabricating a semiconductor device according to claim 2 wherein:

said partially-depleted SOI MOSFET and said fully-depleted SOI MOSFET are n-channel MOSFETs; and boron is injected in said injection step.

6. A method of fabricating a semiconductor device according to claim 1 wherein the gate oxide film is formed by a thermal oxidation method in said first gate oxide film formation step.

7. A method of fabricating a semiconductor device according to claim 2 wherein the gate oxide film is formed by a thermal oxidation method in said first gate oxide film formation step.

* * * * *